US010216700B2

(12) United States Patent
Tinker

(10) Patent No.: US 10,216,700 B2
(45) Date of Patent: Feb. 26, 2019

(54) METHOD AND APPARATUS FOR PULSE WIDTH MODULATION

(71) Applicant: Tempo Semiconductor, Inc., Austin, TX (US)

(72) Inventor: Darrell Eugene Tinker, Austin, TX (US)

(73) Assignee: Tempo Semiconductor, Inc., Austin, TX (US)

( * ) Notice: Subject to any disclaimer, the term of this patent is extended or adjusted under 35 U.S.C. 154(b) by 221 days.

(21) Appl. No.: 15/188,960

(22) Filed: Jun. 21, 2016

(65) Prior Publication Data

US 2017/0170816 A1 Jun. 15, 2017

Related U.S. Application Data

(60) Provisional application No. 62/190,858, filed on Jul. 10, 2015.

(51) Int. Cl.
| | |
|---|---|
| H03K 7/08 | (2006.01) |
| G06F 17/14 | (2006.01) |
| G06F 1/025 | (2006.01) |
| H03K 7/02 | (2006.01) |
| H03K 7/06 | (2006.01) |
| H03K 7/10 | (2006.01) |
| H03K 17/16 | (2006.01) |
| H02M 1/00 | (2006.01) |

(52) U.S. Cl.
CPC ............ *G06F 17/142* (2013.01); *G06F 1/025* (2013.01); *H03K 7/02* (2013.01); *H03K 7/06* (2013.01); *H03K 7/08* (2013.01); *H03K 7/10* (2013.01); *H03K 17/165* (2013.01); *H02M 2001/0003* (2013.01)

(58) Field of Classification Search
CPC .......... H03K 7/08; H03K 17/165; H03K 7/06; H03K 7/02; H03K 7/10; G06F 1/025; G06F 17/142; H02M 2001/0003
USPC ................................ 332/109; 327/26, 33, 36
See application file for complete search history.

(56) References Cited

U.S. PATENT DOCUMENTS 5,077,539 A 12/1991 Howatt
5,617,058 A 4/1997 Adrian et al.

OTHER PUBLICATIONS

Tempo Semiconductor, Inc., "Direct Digital Amplification (DDX®)", published via Tempo website, 2013.

*Primary Examiner* — Richard Tan
(74) *Attorney, Agent, or Firm* — Hunt Pennington Kumar & Dula, PLLC; Artie Pennington; Jeffrey Van Myers

(57) ABSTRACT

A ternary pulse width modulation ("PWM") method and apparatus. In one embodiment, the start of the pulse sequence in the "current" frame is referenced to the end of the pulse sequence in a previous, "reference" frame, rather than to the frame boundary at the start of the current frame, thereby allowing the compensation portion of the pulse sequence to overlap into the preceding or following frame, thus achieving a higher modulation index without dropping the compensation pulses. Although in most instantiations, the reference frame will be the frame immediately preceding in time the current frame, in other instances, the reference frame may be any frame preceding the current frame that falls within the constraints of the timing facility.

15 Claims, 5 Drawing Sheets

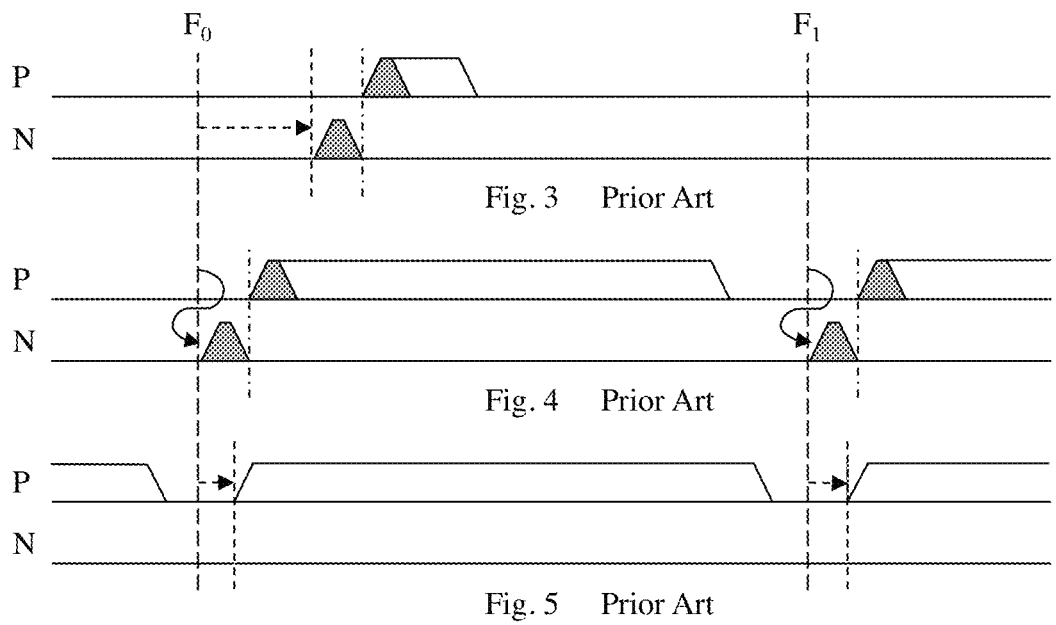
Fig. 3    Prior Art
Fig. 4    Prior Art
Fig. 5    Prior Art
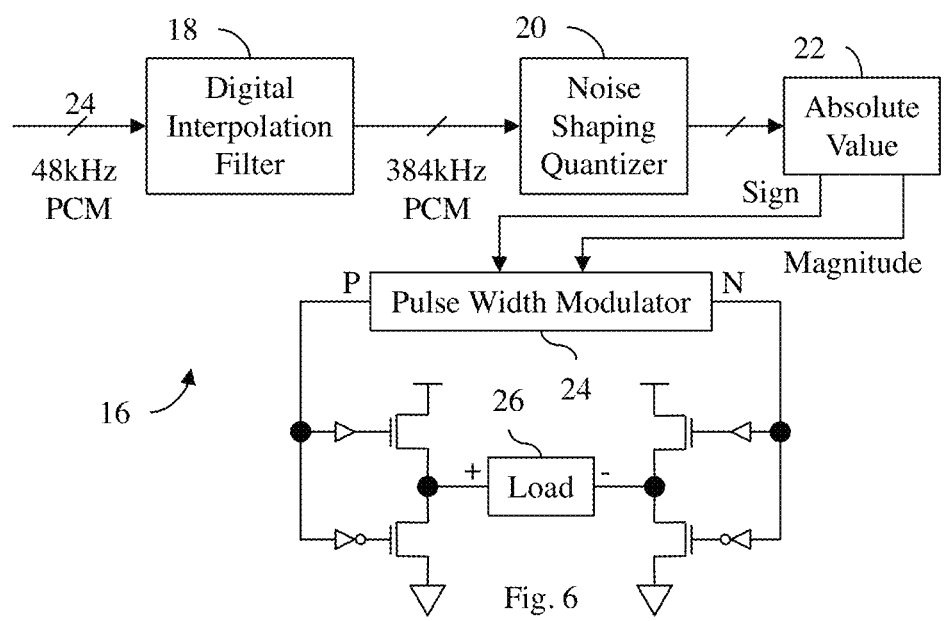
Fig. 6

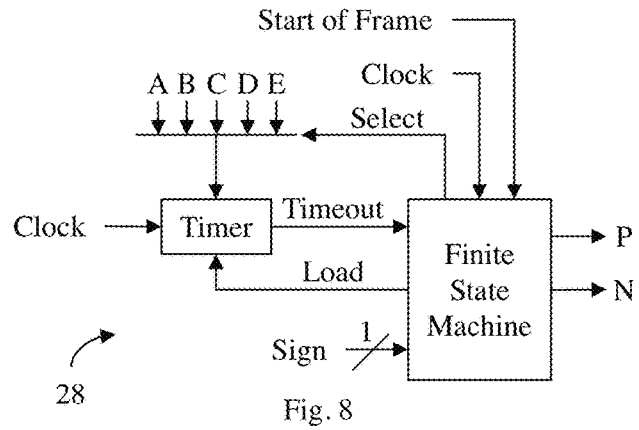

Fig. 8

| State | Actions |
|---|---|
| S0 | Idle. On start of frame: Timer <= B; if Sign negative, go to state S1; else if Sign positive, go to state S4. |
| S1 | Delay N. On Timeout: Timer <=A; go to state S2. |
| S2 | Generate signal N. On Timeout: get next signal; Timer <= D; go to state S3. |
| S3 | Generate compensation N pulses. On Timeout: if low signal or Sign change, go to state S0; else if high signal and Sign negative, Timer <= E, and go to state S1. |
| S4 | Delay P. When Timer ≤ D, generate compensation P pulses. On Timeout: Timer <= A; go to state S5. |
| S5 | Generate signal P. On Timeout: get next signal; if low signal or Sign change, go to state S0; else if high signal and Sign positive, Timer <= C, and go to state S4. |

Fig. 9

METHOD AND APPARATUS FOR PULSE WIDTH MODULATION

CROSS-REFERENCE TO RELATED APPLICATIONS

This application is related to the following:
1. Provisional Application Ser. No. 62/190,858, filed 10 Jul. 2015 ("Parent Provisional");
2. application Ser. No. 14/961,861, filed 7 Dec. 2015 "First Related Application";
3. application Ser. No. 15/060,475, filed 3 Mar. 2016 "Second Related Application"; and
4. International Application No. PCT/US16/26055, filed 5 Apr. 2016 "Third Related Application".

This application claims priority to the Parent Provisional, and hereby claims benefit of the filing date thereof pursuant to 37 CFR § 1.78(a)(4).

The subject matter of the Parent Provisional and the First, Second and Third Related Applications, each in its entirety, is expressly incorporated herein by reference.

BACKGROUND OF THE INVENTION

1. Field of the Invention

The present invention relates to a method and apparatus for pulse width modulation for use with class D amplifier circuits and the like.

2. Description of the Related Art

In general, in the descriptions that follow, I will italicize the first occurrence of each special term of art that should be familiar to those skilled in the art of integrated circuits ("ICs") and systems. In addition, when I first introduce a term that I believe to be new or that I will use in a context that I believe to be new, I will bold the term and provide the definition that I intend to apply to that term. In addition, throughout this description, I will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, I may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, when I refer to a facility I mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless I expressly state to the contrary, I consider the form of instantiation of any facility that practices my invention as being purely a matter of design choice.

Shown in FIG. 1 is a typical general purpose computer system 10. In particular, in recently-developed battery-powered mobile systems, such as smart-phones and the like, many of the discrete components typical of desktop or laptop devices illustrated in FIG. 1 are integrated into a single integrated circuit chip.

Shown by way of example in FIG. 2 is one embodiment of a single-chip audio coder/decoder ("CODEC") 12 comprising: a plurality of digital modules; and a plurality of analog modules. In this embodiment, CODEC 12 includes a Serial Data Interface facility adapted to send data to, and receive digital data from, the system 10; a Digital Phase-Locked Loop ("DPW") facility adapted to determine the timing and rate relationship between two asynchronous data streams; a Configuration Memory and Control facility adapted to control which facilities are used and how, in accordance with configuration and control information received from the system 10; a Digital Signal Processor ("DSP") facility 14 adapted to perform various data processing activities in accordance with a stored computer program; and a Data Memory facility adapted to store, as required, audio data flowing from the system 10 to the audio output devices. I may expand on the functionality of certain of these facilities as I now explain the method of operation of my invention and embodiments thereof.

I believe that ternary pulse width modulation ("PWM") was first disclosed in U.S. Pat. No. 5,077,539, Howatt, issued 31 Dec. 1991 ("Howatt"), and the entire subject matter of which is expressly incorporated herein by reference. An improvement of Howatt was disclosed in U.S. Pat. No. 5,617,058, Adrian, et. al, issued 1 Apr. 1997 ("Adrian"), and the entire subject matter of which is expressly incorporated herein by reference. As was explained in Adrian:

> In an implementation of an all digital switching amplifier according to the invention, non-linearity introduced by non-ideal switches is compensated for by setting a minimum output pulse width such that the effective output pulse energy is not reduced by the non-ideal rise and fall times of the output switch elements. The effective pulse shape remains trapezoidal and does not become triangular. To compensate at the output for the effect of the non-ideal switch rise and fall times, the minimum output pulse is also applied to the load in opposite phase during the same frame to reproduce the waveform such as illustrated in FIG. 5.
>
> The result of this waveform is that zero net energy is delivered to the load during the frame. As the minimum and compensating pulses are applied within a fraction of the frame of each other, and variations in power supply voltage or load characteristics due to external influences occur at much lower than the frame rate, the compensation is not dependent on factors external to the switch. The compensation is dependent on the matching of the switch elements, as different elements may have different rise and fall times. For discrete switch elements of the same type or for a monolithic construction of the switch, these differences are minimal. The compensation is also dependent on the timing characteristics of the switch driver and logic circuits used to convert the word from the signal processor to the output pulsed widths. Careful consideration to the timing characteristic of these elements has been made to minimize the differences in producing positive and negative pulses. During the time of a single frame, any remaining difference can be considered invariant and does not affect the performance of the compensation. A net residual difference between the two pulses results in a fixed offset of the zero output. This offset may be compensated by subtraction from the original digital data but is generally negligible for most applications, as are changes in the offset due to external influence such as time and temperature.

When a signal is applied, the resulting effective pulse width is then only dependent on the time increment commanded. The output resolution is therefore only limited by the ability to control the relative increment, which can be extended to effect continuous control of the pulse width. FIG. 6A and 6B illustrate, respectively, the negative and positive compensated outputs derived from the ideal pulse command. The cancellation provided by the minimum pulse and the compensating pulse leave an effective net energy that is only dependent on the ideal commanded width. According to the invention, as discussed in greater detail hereinafter, the modulation commands, i.e. minimum and compensating pulse, are stored in a pulse command table, rather than being computed on the fly. The output of a noise shaper points to the pulse command table. The substantially linear output resulting from application of the compensating pulse(s) is illustrated in FIG. 7. Col. 6, line, 43 to col. 7, line 11.

The Adrian invention was initially commercialized by Apogee Technology, Inc., and the hardware instantiations thereof were marketed under the registered trademark DDX®. Although Apogee is no longer a going concern, instantiations of this technology are available today from Tempo Semiconductor, Inc. ("Tempo"), the assignee of the present application. In support of these products, Tempo published, in 2013, a white paper entitled "Direct Digital Amplification (DDX®)" (the "White Paper"), a copy of which is submitted herewith and the entire subject matter thereof is expressly incorporated herein by reference. As can be seen in FIG. 3 of the White Paper, a bridge-tied load is selectively driven between three states: a positive state, a damped state, and a negative state; a fourth state, zero state, is also possible wherein both sides of the bridge are driven high rather than low as in the damped state. As noted in Adrian, distortion in the ternary PWM output stream can be reduced by developing signal and compensation pulses that follow a predetermined sequence of edge transitions with minimum pulse widths, and then increasing the pulse width of either the positive, P, or negative, N, signal pulses beyond the minimum width to achieve signal modulation.

By way of example, FIG. 3 and FIG. 4 illustrate the Adrian method for a positive signal. At a low modulation index, as in FIG. 3, the P pulse is a little wider than the minimum width. Note that, at the compensation pulse boundary, i.e., between the first phase and the last phase of the compensation pulses (shaded), the edges of the N and P pulses can be aligned, spaced-apart, or overlapping, as long as this relationship is consistent across all frames. As in Adrian, the shaded portion of the compensation pulse of the same polarity as the signal is shaped identically to the opposite polarity compensation pulse, in order to illustrate that the net effect of the compensation pulses is a zero; in reality, the same polarity compensation pulse is contiguous with the signal pulse. Although, in this example, I have shown the negative portion of the compensation pulse as always preceding the positive portion, those skilled in this art will recognize that the order may be reversed.

At a high modulation index, as in FIG. 4, the P pulse in the current frame is typically much wider than the selected minimum pulse width, and the N compensation pulse in this frame has been pushed all the way to the leading edge of the current frame boundary. Because the positions of the P and N pulses within each frame are determined by timer count values that are referenced with respect to the leading edge of the current frame, the modulation index cannot increase any further using this prior art approach without dropping the compensation pulses from the developed compensated composite waveforms. As can be seen in FIG. 5, the Adrian approach is not well adapted to develop effective compensation pulses as the modulation index approaches a relative maximum at which the leading edge of the P pulse occurs very close to the leading edge of the current frame boundary. There is a need for a method to implement a ternary PWM having a higher modulation index without dropping any compensation pulses.

BRIEF SUMMARY OF THE INVENTION

In accordance with a first embodiment of my invention, I provide a ternary pulse width modulation ("PWM") method for use in an oversampled digital signal processing system. In accordance with this embodiment, I receive a first input sample during a reference frame; and, in response, I develop a first compensated composite waveform as a function of at least the first input sample. I then receive a second input sample during a current frame; and, in response, I develop a second compensated composite waveform as a function of the second input sample and a selected one of the first compensated composite waveform and a boundary of the reference frame that is not a boundary of the current frame.

In accordance with one other embodiment of my invention, a PWM facility may be adapted to practice my ternary PWM method.

In accordance with yet another embodiment of my invention, a digital signal processing system may comprise a PWM facility adapted to practice my ternary PWM method.

In accordance with still another embodiment of my invention, a non-transitory computer readable medium may include executable instructions which, when executed in a processing system, causes the processing system to perform the steps of my ternary PWM method.

BRIEF DESCRIPTION OF THE SEVERAL VIEWS OF THE DRAWINGS

My invention may be more fully understood by a description of certain preferred embodiments in conjunction with the attached drawings in which:

FIG. 3 illustrates, in time line format, an example of a positive-modulated PWM signal developed by a prior art ternary PWM method, with a relatively low modulation index and compensation pulses;

FIG. 4 illustrates, in time line format, an example of a positive-modulated PWM signal developed by a prior art ternary PWM method, with a maximum modulation index compatible with compensation pulses;

FIG. 5 illustrates, in time line format, an example of a positive-modulated PWM signal developed by a prior art ternary PWM method, with a higher modulation index than in the example of FIG. 4 but without compensation pulses;

FIG. 6 illustrates, in block diagram form, one embodiment of a pulse width modulation signal chain adapted to develop ternary PWM signals to drive a bridge-connected load;

FIG. 8 illustrates, a pulse width modulation facility adapted to practice my ternary PWM method in a PWM signal chain such as is shown in FIG. 6;

FIG. 9 illustrates, in state table format, one example control flow of the finite state machine shown in FIG. 8;

Figure 1:
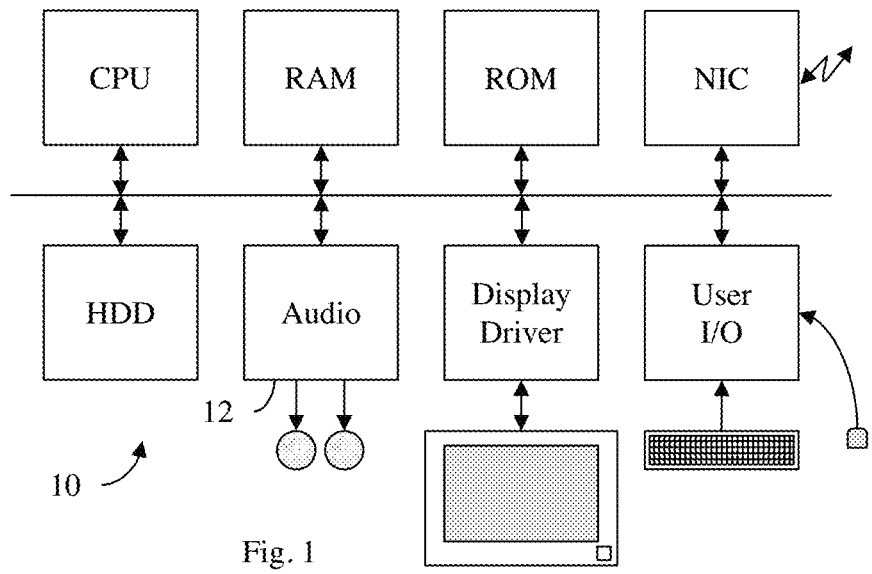
FIG. 1 illustrates, in block diagram form, a general purpose computer system adapted to practice my invention.
Figure 2:
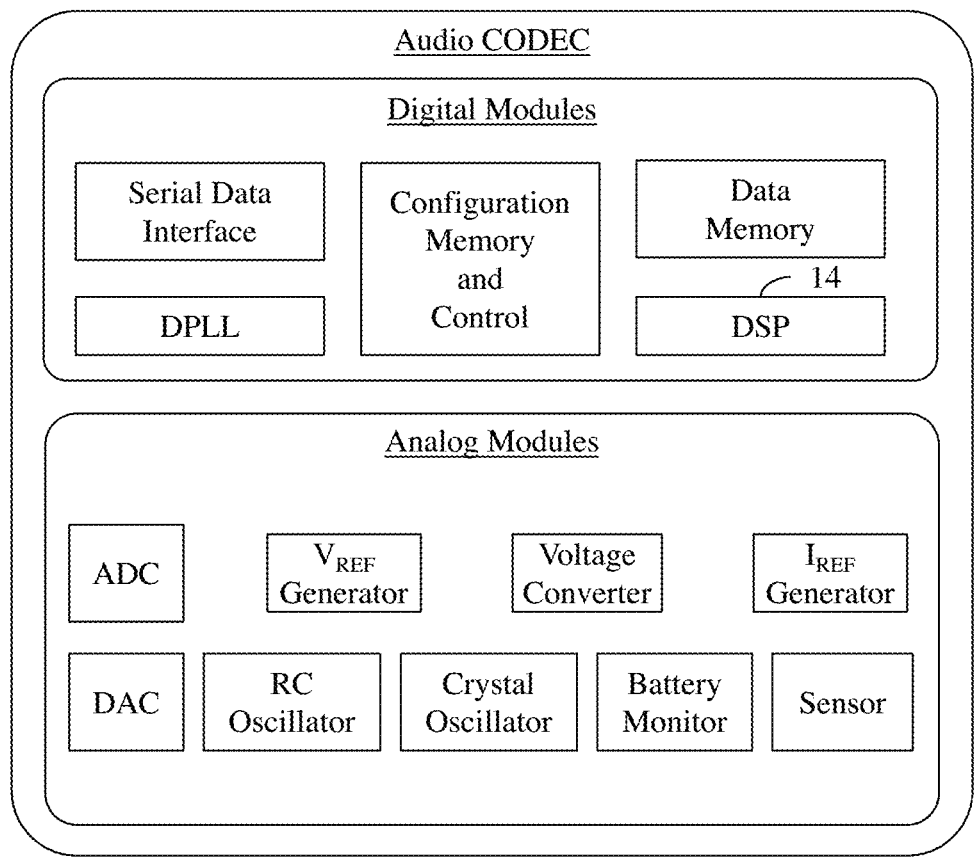
FIG. 2 illustrates, in block diagram form, a typical integrated system adapted to practice my invention.

In the drawings, similar elements will be similarly numbered whenever possible. However, this practice is simply for convenience of reference and to avoid unnecessary proliferation of numbers, and is not intended to imply or suggest that my invention requires identity in either function or structure in the several embodiments.

DETAILED DESCRIPTION OF THE INVENTION

In accordance with my invention, the start of the pulse sequence in the current frame is referenced, not to the leading edge of the current frame boundary but rather to an event in a previous reference frame, e.g., the trailing edge of the last pulse in the signal pulse sequence, or a boundary of the reference frame that is not a boundary of the current frame. By allowing the compensation portion of the pulse sequence to overlap into the preceding or following frame, a higher modulation index may be achieved without dropping the compensation pulses. Although in most cases, the reference frame will be the frame immediately preceding in time the current frame, it is possible to select as the reference frame any frame preceding the current frame that falls within the constraints of the timing facility.

Figure 7:
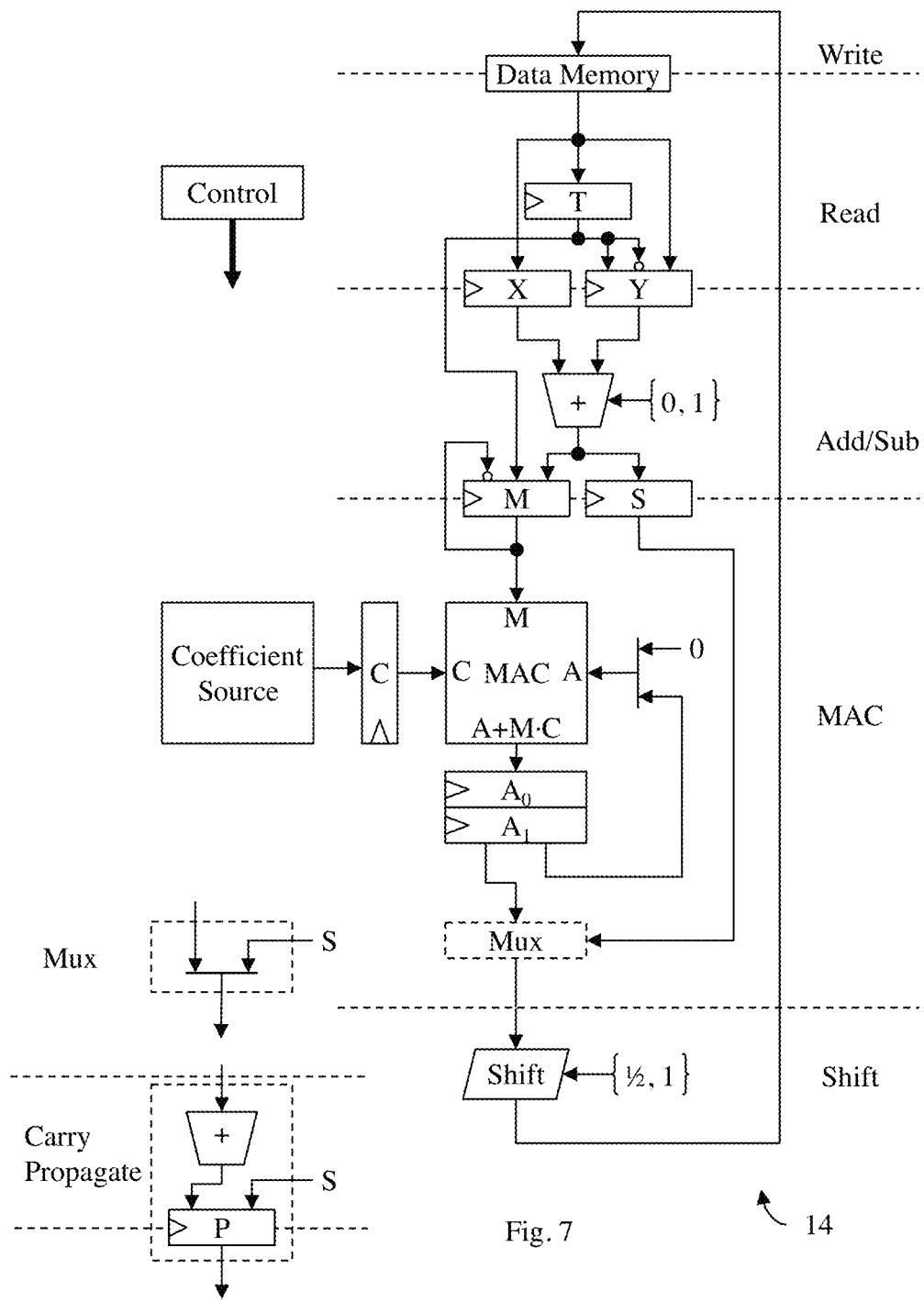
FIG. 7 illustrates, in block diagram form, one embodiment of a digital signal processor that may be employed to perform interpolation filtering and other processing to support my ternary PWM method.

In FIG. 6, I have illustrated one embodiment of a PWM signal chain 16, comprising a digital interpolation filter 18, a noise shaping quantizer 20, an absolute value facility 22 and a PWM facility 24, adapted to develop ternary PWM signals to drive a bridge-connected load 26. In general, the same datapath hardware disclosed in my Related Applications, shown in FIG. 7 for convenience of reference, may be employed to perform interpolation filtering and other processing to support my new and improved ternary PWM methods.

In FIG. 8, I have illustrated one embodiment of a pulse width modulation facility 28 adapted to practice my ternary PWM method in a PWM signal chain 16 such as is shown in FIG. 6. In this embodiment, the finite state machine ("FSM"), operating in accordance with the state table shown in FIG. 9, selectively loads one of the following calculated values into the timer:

A=current pulse width $$B = \frac{n - A}{2}$$

$$C = n - \frac{A}{2} - \frac{A'}{2}$$

D=compensation pulse width

E=C−D where:
n=number of clock cycles per frame; and
a primed value comprises the enumerated value from a reference frame.

Figure 10:
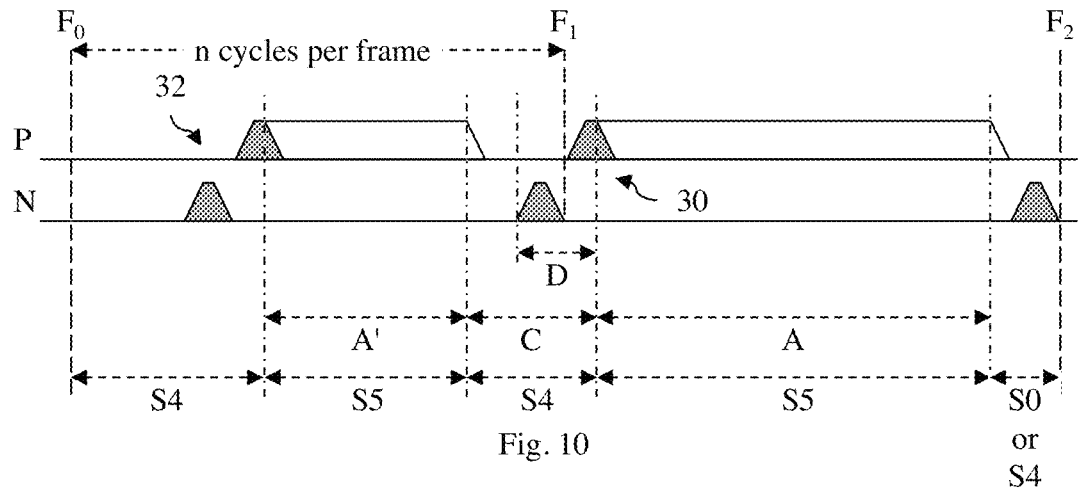
FIG. 10 illustrates, in time line format, an example of a PWM signal developed by a ternary PWM method in accordance with my invention, with positive polarity and high signal amplitude.

FIG. 10 illustrates an example of a pulse train developed by my method in a positive modulation, high signal amplitude mode of operation. Note that, in the current frame, $F_1$, the leading edge of the P signal pulse in the second compensated composite waveform 30 (both the N and P compensation pulses of which are shown in dark gray) is timed with respect to the trailing edge of the P signal pulse in the first compensated composite waveform 32 (both the N and P compensation pulses of which are also shown in dark gray) in the immediately-preceding reference frame, $F_0$, (see, time interval C in FIG. 10) rather than with respect to the leading edge of the $F_1$ frame boundary as in Adrian. This allows the N compensation pulse to overlap the $F_1$ frame boundary, so that at the same modulation index as in FIG. 5, the N compensation pulses can still be developed. This increases the maximum modulation index that can be achieved before the N compensation pulses are dropped, thereby delaying the onset of an increase in distortion. As can be seen in this example, the C time interval function (see, above) represents the number of clock cycles from the trailing edge of the P signal pulse in $F_0$ until the leading edge of the first P signal pulse in $F_1$, but not including the P compensation pulse; this clearly illustrates how my method allows modulation to be performed as a function of at least two frames. Further, the second compensated composite waveform 30 in FIG. 10 may be developed as a function of boundary F0 of the reference frame, which is not a boundary of the current frame F1. In this embodiment, since the start of compensated composite waveform 30 is timed with respect to boundary F0, it is now possible for the P compensation pulse itself to overlap boundary F1.

Figure 11:
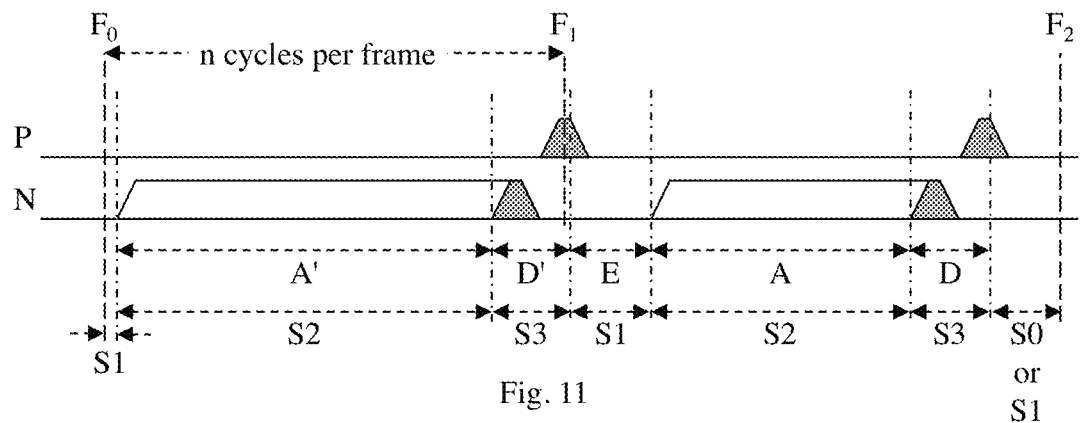
FIG. 11 illustrates, in time line format, an example of a PWM signal developed by a ternary PWM method in accordance with my invention, with negative polarity and high signal amplitude.

FIG. 11 illustrates an example of a pulse train developed by my method in a negative modulation, high signal amplitude mode of operation. Note that, in this example, the P compensation pulse for $F_0$ actually crosses the frame boundary between $F_0$ and $F_1$.

Figure 12:
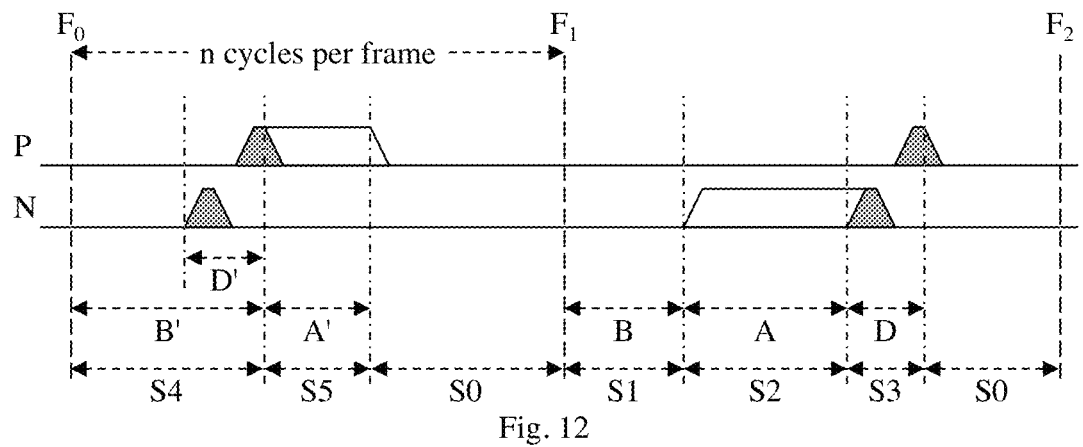
FIG. 12 illustrates, in time line format, an example of a PWM signal developed by a ternary PWM method in accordance with my invention, illustrating a positive to negative zero crossing.

FIG. 12 illustrates an example of a pulse train developed by my method in a positive-to-negative zero crossing mode of operation. Note that, in this example, the pulse timing calculations are functions solely of events in the current frame, $F_1$, without reference to any previous reference frame.

Although I have described my invention in the context of particular embodiments, one of ordinary skill in this art will readily realize that many modifications may be made in such embodiments to adapt either to specific implementations. Thus it is apparent that I have provided a ternary pulse width modulation method and apparatus that are both effective and efficient. Further, I submit that my method and apparatus provide performance generally superior to the best prior art techniques.

What I claim is:

1. A ternary pulse width modulation ("PWM") method adapted for use with a PWM signal chain, the method comprising using the PWM signal chain to perform steps of:
   [1.1] receiving a first input sample during a reference frame;
   [1.2] developing a first compensated composite waveform as a function of at least the first input sample;
   [1.3] receiving a second input sample during a current frame; and
   [1.4] developing a second compensated composite waveform as a function of the second input sample and a selected one of the first compensated composite waveform and a boundary of the reference frame that is not a boundary of the current frame.

2. The method of claim 1 wherein the reference frame immediately precedes in time the current frame.

3. The method of claim 2 wherein a compensation portion of the second compensated composite waveform overlaps in time a frame boundary between the reference frame and the current frame.

4. The method of claim 2 wherein a compensation portion of the second compensated composite waveform precedes in time a frame boundary between the reference frame and the current frame.

5. The method of claim 2 wherein a compensation portion of the first compensated composite waveform overlaps in time a frame boundary between the reference frame and the current frame.

6. The method of claim 2 wherein a compensation portion of the first compensated composite waveform succeeds in time a frame boundary between the reference frame and the current frame.

7. In a ternary pulse width modulation ("PWM") method adapted for use with a PWM signal chain, the method comprising using the PWM signal chain to perform steps of:
   [7.1] receiving a first input sample during a first frame; and
   [7.2] developing a first compensated composite waveform as a function of the first input sample;
   an improvement comprising using the PWM signal chain to perform additional steps of:
   [7.3] receiving a second input sample during a second frame; and
   [7.4] developing a second compensated composite waveform as a function of the second input sample and a selected one of the first compensated composite waveform and a boundary of the first frame that is not a boundary of the current frame.

8. The method of claim 7 wherein the first frame immediately precedes in time the second frame.

9. The method of claim 8 wherein a compensation portion of the second compensated composite waveform overlaps in time a frame boundary between the first frame and the second frame.

10. The method of claim 8 wherein a compensation portion of the second compensated composite waveform precedes in time a frame boundary between the first frame and the second frame.

11. The method of claim 8 wherein a compensation portion of the first compensated composite waveform overlaps in time a frame boundary between the first frame and the second frame.

12. The method of claim 8 wherein a compensation portion of the first compensated composite waveform succeeds in time a frame boundary between the first frame and the second frame.

13. A ternary PWM facility configured to perform the method of any one of the claims 1 to 12.

14. A digital signal processing system comprising the ternary PWM facility according to claim 13.

15. A non-transitory computer readable medium including executable instructions which, when executed in a processing system, causes the processing system to perform the steps of the method according to any one of claims 1 to 12.

* * * * *